(12) United States Patent
Wu (10) Patent No.: US 10,561,034 B2
(45) Date of Patent: Feb. 11, 2020

(54) LOCATING DEVICE

(71) Applicant: HANWIT PRECISION INDUSTRIES LTD., New Taipei (TW)

(72) Inventor: Ming-De Wu, New Taipei (TW)

(73) Assignee: Hanwit Precision Industries Ltd., New Taipei (TW)

( * ) Notice: Subject to any disclaimer, the term of this patent is extended or adjusted under 35 U.S.C. 154(b) by 0 days.

(21) Appl. No.: 16/411,600

(22) Filed: May 14, 2019

(65) Prior Publication Data

US 2019/0394893 A1 Dec. 26, 2019

Related U.S. Application Data

(63) Continuation-in-part of application No. 16/241,362, filed on Jan. 7, 2019.

(30) Foreign Application Priority Data

Jun. 26, 2018 (TW) .............................. 10712932 A (51) Int. Cl.
*G06F 1/16* (2006.01)
*H05K 5/02* (2006.01)

(52) U.S. Cl.
CPC ........... *H05K 5/023* (2013.01); *H05K 5/0204* (2013.01); *H05K 5/0221* (2013.01); *H05K 5/0226* (2013.01)

(58) Field of Classification Search
CPC ....................................................... G06F 1/187

USPC .......... 361/379.33, 679.37, 679.58, 726–727
See application file for complete search history.

(56) References Cited

U.S. PATENT DOCUMENTS

| | | | | |
|---|---|---|---|---|
| 5,358,135 A | * | 10/1994 | Robbins | H02B 1/066 220/326 |
| 6,356,441 B1 | * | 3/2002 | Claprood | G06F 1/184 312/332.1 |
| 9,727,099 B1 | * | 8/2017 | Hastings | G06F 1/187 |
| 2016/0357229 A1 | * | 12/2016 | Moore | G06F 1/187 |

* cited by examiner

*Primary Examiner* — Anthony Q Edwards
(74) *Attorney, Agent, or Firm* — Muncy, Geissler, Olds & Lowe, P.C.

(57) ABSTRACT

A locating device includes a guiding member, a sliding assembly and a pulling assembly. The guiding member includes a guiding space, and the sliding assembly includes a shaft part. The pulling assembly includes a pulling member, and the pulling member includes a sliding member inserted into the guiding space. An axis coupling part is disposed between the sliding member and the pulling member and pivotally connected to the shaft part. When the pulling member of the pulling assembly is operated to open or close, the sliding member is longitudinally moved in the guiding space to make the sliding assembly simultaneously move laterally, so as to form an open state or a closed state. As a result, a complicated assembly operation using screw for locking can be omitted, and the effect of decreasing whole operational difficulty and improving whole assembling speed can be achieved.

10 Claims, 8 Drawing Sheets

FIG.8

LOCATING DEVICE

This application is a Continuation-In-Part of co-pending application Ser. No. 16/241,362, filed on Jan. 7, 2019, for which priority is claimed under 35 U.S.C. § 120, the entire contents of which are hereby incorporated by reference.

BACKGROUND OF THE INVENTION

1. Field of the Invention

The present invention relates to a locating device. More particularly, in the locating device, a pulling member of a pulling assembly can be pulled to rotate, to make a sliding member longitudinally slide to an open position or a closed position in the guiding space inside a guiding member, and the sliding assembly can drive a plate to laterally move to form an open state or a closed state, thereby decreasing assembly operational difficulty and improving whole assembling speed.

2. Description of the Related Art

In recent years, a large number of storage medium machines are usually placed and located in a general host computer chassis, a server chassis, a storage or telecommunications cabinet, the operation of replacing the storage medium machine must be simpler and faster for a user to perform repair or replacement work on each recording medium machine, and the assembly structure and component manufacturing costs need to be considered in order to meet the great amount of requirements and costs of the storage medium machines. Furthermore, the chassis is usually used for a long-term period, so it is necessary to consider the stability of the overall system and the convenience of repair and replacement, to facilitate the user to operate, thereby reducing the loss of downtime and manpower. However, some of the storage medium machines currently used are fastened and located in the chassis by screw locking manner, and the screws are inserted through holes of the chassis and then locked into the screw holes of the storage medium machine, respectively. The screw locking manner requires a lot of screws, and the screws also must be removed one by one in order to demount the storage medium machine, and it results in a lot of man-hours for assembly, and significantly increased downtime for maintenance. When the chassis is filled with interface cards, storage medium machines, power lines, cables and other devices, it is very inconvenient to insert a tool for locking screw, and the screw possibly falls to lost during the locking operation. Furthermore, if the size of the screw does not match the screw hole but the screw is still locked into the screw hole by force it is easy to damage the screw hole on the storage medium machine, and it is not convenient for further assembly or disassembly. Since the server chassis is widely used in machine rooms of telecommunication or storage systems and data center, what is needed is to develop a locating device to locate a group of storage medium machines in the server chassis without occupying too much space, and the storage medium machine can be repaired or replaced easily, so that the number of the storage medium machines installed in the machine room can be greatly increased and the user can quickly and easily dismount the storage medium machine for repair and replacement.

SUMMARY OF THE INVENTION

An objective of the present invention is that a guiding member of a locating device includes a guiding space formed inside thereof, and the guiding member includes a fastening part disposed on a surface thereof, and a sliding assembly of the locating device comprises a shaft part disposed inside thereof, and a pulling assembly of the locating device comprises a pulling member, and the pulling member comprises a sliding member disposed on a side thereof and configured to longitudinally reciprocate in the guiding space of the guiding member, and the pulling assembly comprises an axis coupling part disposed on other side thereof opposite to the sliding member and configured to pivotally connect to the shaft part of the sliding assembly. When the pulling assembly is operated to close, the sliding member is longitudinally moved upwardly to the closed position in the guiding space, and make the sliding assembly simultaneously slide in an another direction opposite to the sliding direction of the sliding member. When the pulling assembly is operated to open, the sliding member is longitudinally moved downwardly to an open position in the guiding space, and make the sliding assembly simultaneously move back. As a result, a user can operate the locating device of the present invention, instead of the complicated assembly operation using screw fir locking, so as to achieve the purpose of decreasing whole operational difficulty and improving whole assembling speed.

Another objective of the present invention is that, when the pulling assembly is pulled to rotated to form the closed state, the engaging assembly can clasp the pulling assembly to form a locked state, so that the operation of downwardly pulling to rotate once can be used to directly lock the pulling assembly without additional locking operation, thereby achieving simple operation and faster whole assembling operation speed.

Another objective of the present invention is that, when the engaging assembly is opened, a convex push part of a push member can make the pulling member of the pulling assembly bounce upwardly, so that the pulling member of the pulling assembly can be pulled easily, thereby achieving the purpose of improving smoothness of the pulling operation.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

Figure 1:
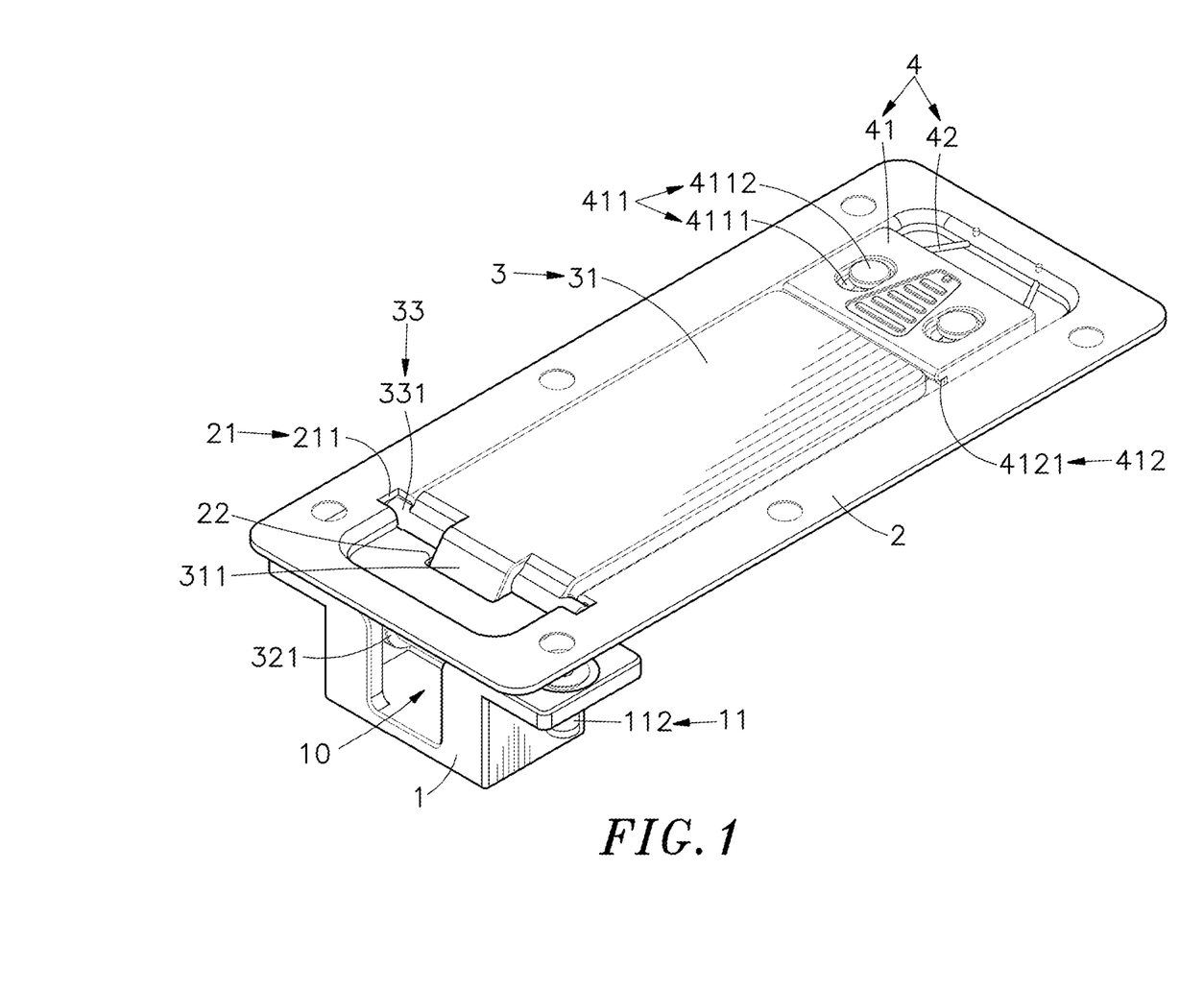
FIG. 1 is an elevational view of a locating device of the present invention.
Figure 2:
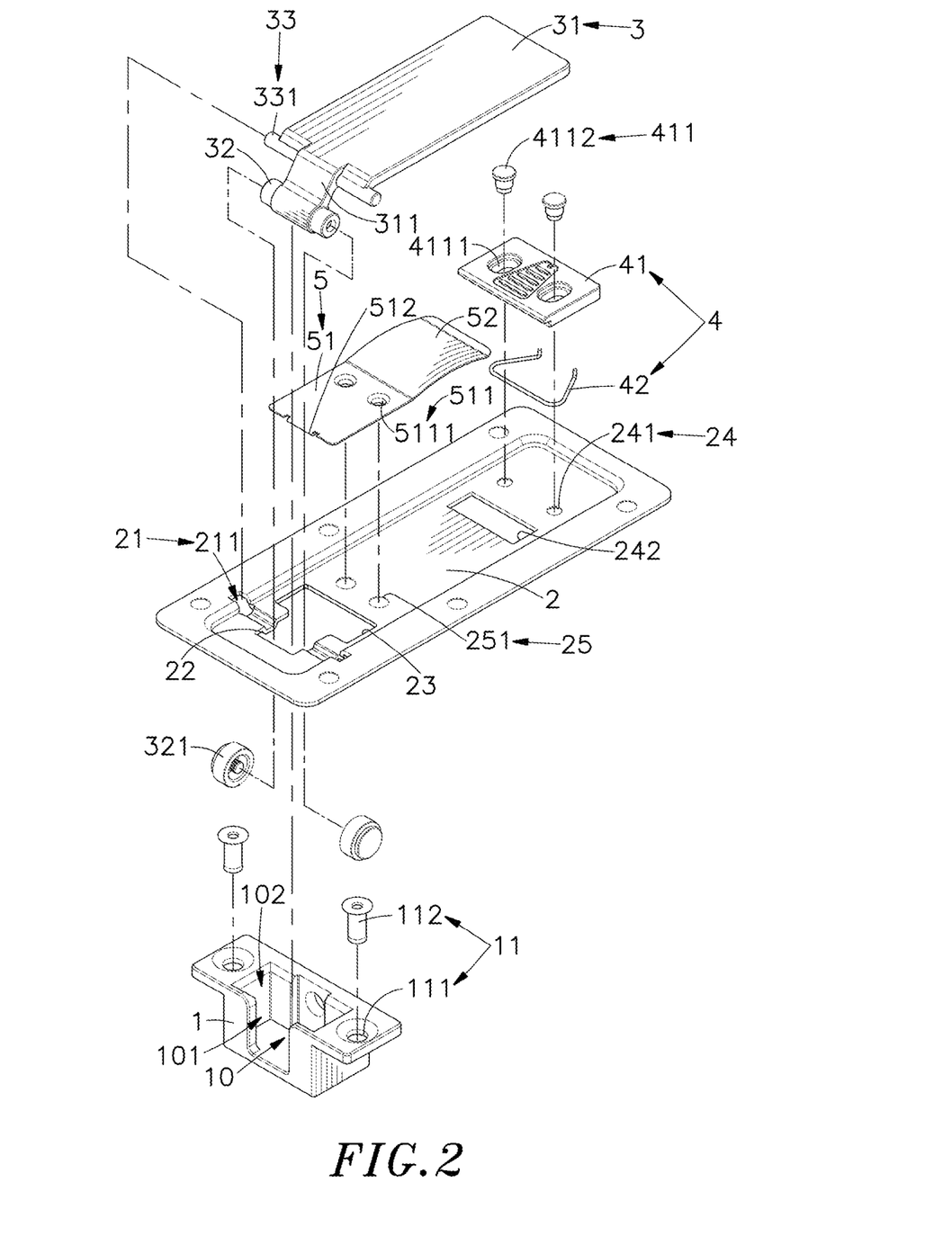
FIG. 2 is a perspective exploded view of a locating device of the present invention.
Figure 3:
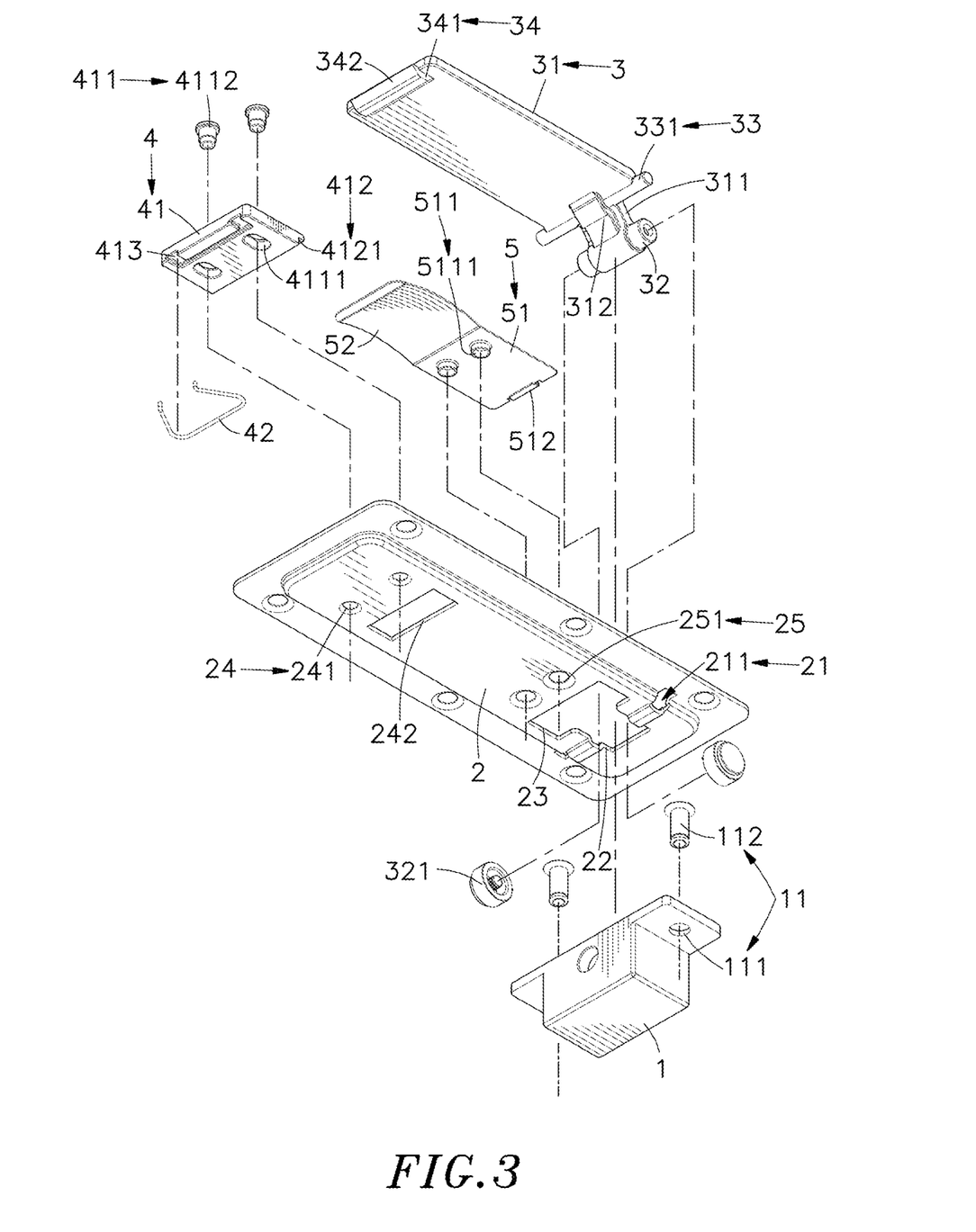
FIG. 3 is a perspective exploded view of a locating device of the present invention, when viewed from another angle.
Figure 4:
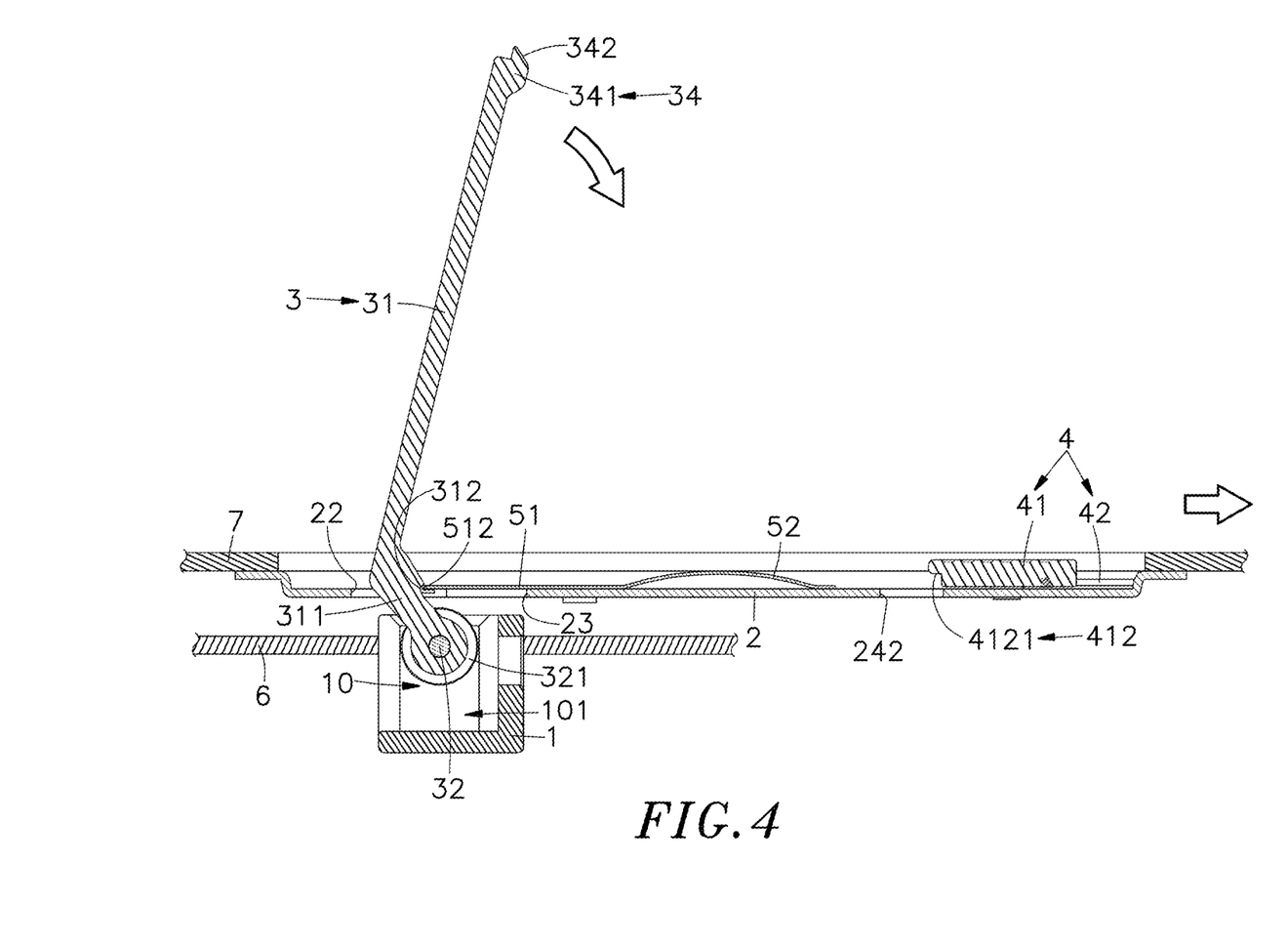
FIG. 4 is a sectional side view of a pulling assembly assembled on a guiding member, according to the present invention.
Figure 5:
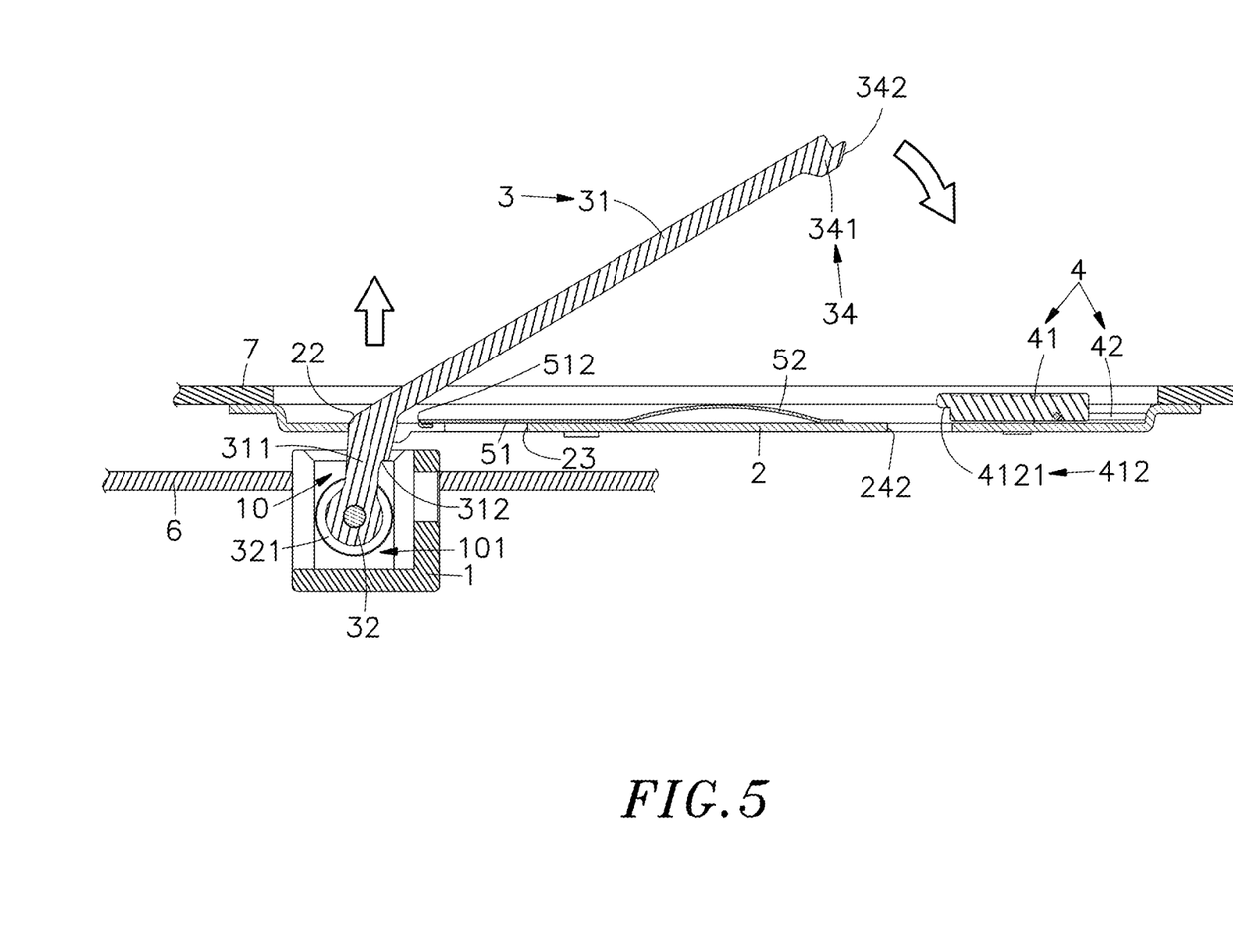
FIG. 5 is a sectional side view of a pulling assembly according to the present invention, while the pulling assembly is being closed.
Figure 6:
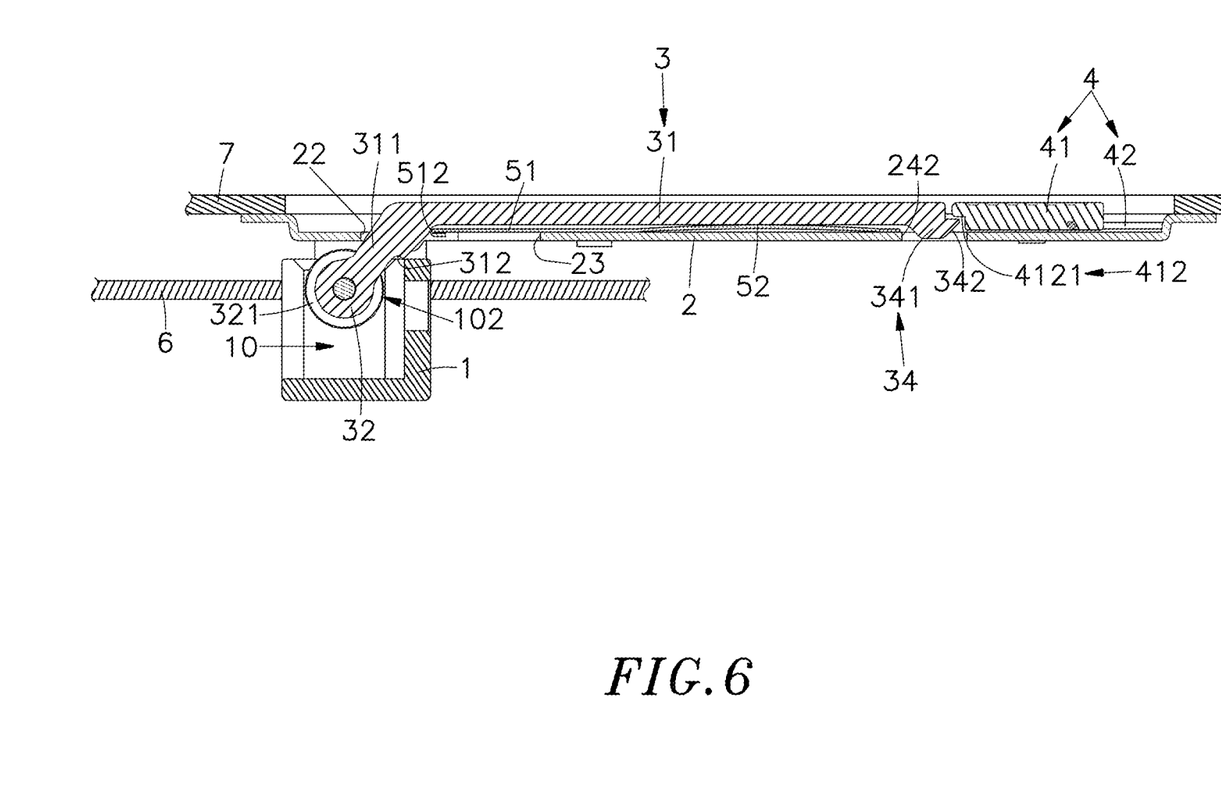
FIG. 6 is a sectional side view of a locating device of the present invention, after the pulling assembly is closed.

Please refer to FIGS. 1 to 3. The locating device of the present invention can include a guiding member 1, a sliding assembly 2, a pulling assembly 3, an engaging assembly 4, and a push member 5.

The guiding member 1 has a guiding space 10 formed inside thereof, and a fastening part 11 disposed on a surface thereof. The fastening part 11 has a plurality of fastening holes 111 cut through two opposite sides of the surface of the guiding member 1, and a plurality of first fixing elements 112 disposed in the fastening holes 111, respectively.

The sliding assembly 2 includes a shaft part 21 disposed inside thereof, and the shaft part 21 has two opposite shaft holes 211 cut through a surface of the sliding assembly 2. The sliding assembly 2 has a pass hole 22 formed on the surface thereof and between the two shaft holes 211, and a rectangular through hole 23 outwardly cut through a rear sidewall of the pass hole 22 and having a larger outer diameter, and a first locating part 24 disposed on a rear part of the surface thereof. The first locating part 24 has a plurality of first locating holes 241 formed on the surface of the sliding assembly 2, and a hole 242 formed in front of the first locating holes 241. A second locating part 25 is disposed between the first locating part 24 and the through hole 23, and the second locating part 25 has a plurality of second locating holes 251 formed on the surface of the sliding assembly 2.

The pulling assembly 3 includes a rectangular pulling member 31. The pulling member 31 includes a shaft block 311 obliquely extended from a side thereof, and the shaft block 311 has a press groove 312 recessed on a bottom surface thereof. A sliding member 32 is disposed on an end of the shaft block 311, and includes pulleys 321 mounted on two opposite sides thereof, respectively. The pulling assembly 3 comprises an axis coupling part 33 disposed on a side thereof opposite to the sliding member 32. The axis coupling part 33 includes a shaft 331 outwardly extended from two opposite sides thereof. The pulling member 31 includes an engaging member 34 disposed on a bottom thereof and including a buckle 341 outwardly extended therefrom. The buckle 341 has a guiding incline 342 formed on a rear side thereof.

The engaging assembly 4 can comprise a clasping member 41 and an elastic element 42. The clasping member 41 comprises a first connection part 411 disposed on a surface thereof. The first connection part 411 includes a plurality of combination holes 4111 cut therethrough, and a plurality of fastening members 4112 disposed on in the combination holes 4111, respectively. The clasping member 41 comprises a clasping part 412 disposed on a front side thereof, and the clasping part 412 has a clasping groove 4121 recessed on a bottom surface of the clasping member 41. A U-shaped accommodating groove 413 is recessed behind the clasping groove 4121, and the elastic element 42 is accumulated in the accommodating groove 413.

In an embodiment, the push member 5 can be made by elastic material, and include a base part 51 in a flat shape. The base part 51 includes a second connection part 511 disposed on a surface thereof, and the second connection part 511 of the base part 51 has a plurality of riveting holes 5111 cut therethrough. The base part 51 includes an abutting part 512 folded from a side thereof and a push part 52 extended from other side thereof and having a convex shape.

In order to assemble the locating device of the present invention, the sliding member 32 of the pulling assembly 3 can be inserted through the through hole 23 and laterally moved forwardly, to make the shaft block 311 of the pulling member 31 laterally insert into the pass hole 22, and the axis coupling part 33 of the pulling assembly 3 can be pivotally connected to the shaft part 21 of the sliding assembly 2, and the shaft 331 of the axis coupling part 33 can be inserted into the shaft hole 211 of the shaft part 21, so that the shaft 331 of the axis coupling part 33 can be located under the sliding assembly 2 to form a pivotally-connected state, and the pulling assembly 3 can be repeatedly pulled to pivot on the axis coupling part 33 and then move back and forth on the sliding assembly 2. The fastening member 4112 of the engaging assembly 4 can be inserted through the combination hole 4111, to fix the clasping member 41 in the first locating hole 241 of the first locating part 24. The base part 51 of the push member 5 can be used to cover the through holes 23, and the riveting holes 5111 of the second connection part 511 can be riveted into the second locating holes 251 of the second locating part 25 for combining and locating. As a result, the operation of assembling the locating device of the present invention is completed.

Please refer to FIGS. 4 to 8. As shown in FIGS. 4 to 8, the guiding member 1 can be combined on a plate 6 of a server chassis, a host computer, a storage cabinet, telecommunications cabinet, or other accommodation container. The sliding assembly 2 can be combined on a lid 7 of the aforementioned container or cabinet, and when the lid 7 is downwardly closed, the sliding assembly 2 can be located above the top opening of the guiding space 10, and the sliding member 32 of the pulling assembly 3 can be aligned and inserted into the guiding space 10 of the guiding member 1, to make the pulleys 321 on two opposite sides of the sliding member 32 enter the guiding space 10 and abut against the inside wall. At this time, the pulleys 321 on two opposite sides of the sliding member 32 are located at an open position 101 on the bottom of the guiding space 10. Next, the pulling member 31 of the pulling assembly 3 can be rotated about the axis coupling part 33, to pull the pulling member 31 to clockwise rotate, so as to form a closed state. At the same time, the pulleys 321 of the sliding member 32 are upwardly moved to a closed position 102 on the top of the guiding space 10, and the axis coupling part 33 of the pulling assembly 3 can drive the shaft part 21 of the sliding assembly 2 to laterally move, so that the sliding assembly 2 can laterally move the lid 7 simultaneously, to form the closed state. At this time, the engaging member 34 of the pulling assembly 3 can abut against, by the guiding incline 342 of the buckle 341, the clasping part 412 on front side of the clasping member 41 of the engaging assembly 4, so that the clasping member 41 can be laterally moved backwardly to squeeze and deform the elastic element 42. After the buckle 341 of the engaging member 34 enters the clasping groove 4121 of the clasping part 412, the elastic element 42 can be elastically recovered, to make the clasping member 41 laterally move forwardly, so that the buckle 341 of the engaging member 34 can be inserted into the hole 242 of the first locating part 24 to stably clasp the clasping groove 4121 of the clasping part 412, to form a locked state. At the same time, the pulling member 31 of the pulling assembly 3 can press the push part 52 of the push member 5 by a bottom surface thereof.

Figure 7:
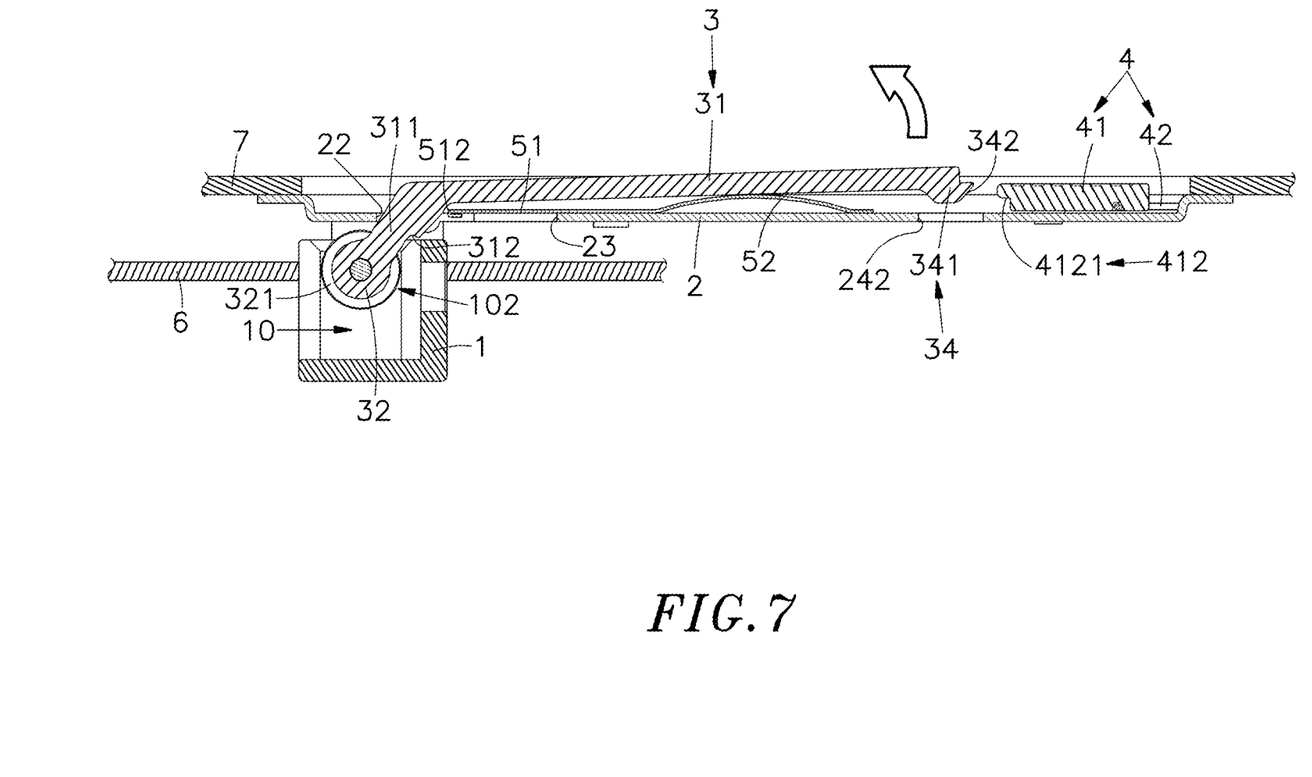
FIG. 7 is a sectional side view of an engaging assembly of the present invention, when the engaging assembly is opened.
Figure 8:
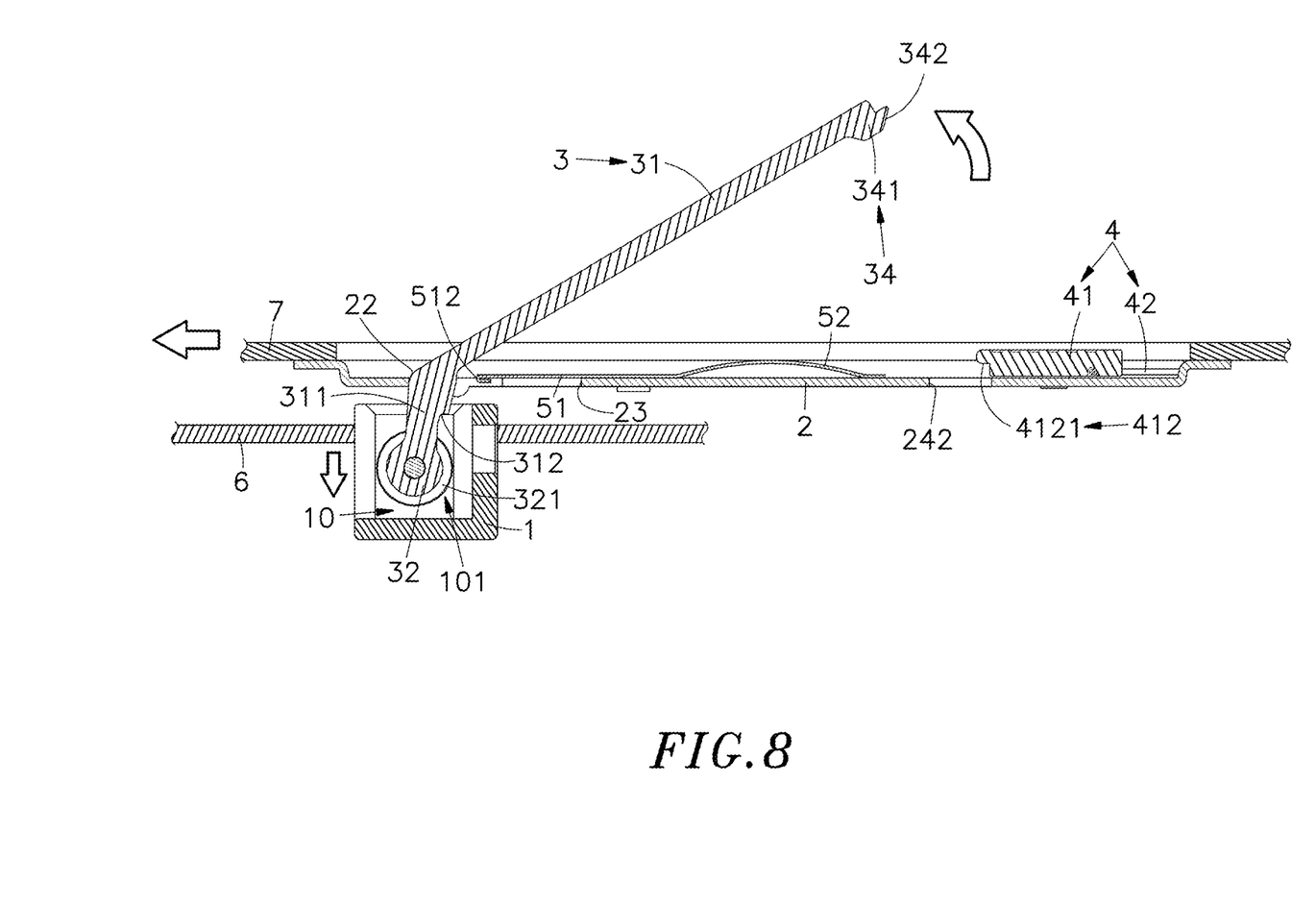
FIG. 8 is a sectional side view of a pulling assembly of the present invention, when the pulling assembly is opened.

In order to separate the lid 7 from the locating device of the present invention, the clasping member 41 of the engaging assembly 4 can be laterally moved backwardly, to separate the engaging member 34 of the pulling assembly 3 from the clasping part 412 of the clasping member 41, and at the same time, the push part 52 of the push member 5 is upwardly abutted against the bottom surface of the pulling member 31 of the pulling assembly 3, to make the pulling member 31 upwardly bounce, so as to rotate the pulling member 31 counter-clockwise to form an open state, and simultaneously move the pulleys 321 of the sliding member 32 downwardly to the open position 101. The sliding assembly 2 can simultaneously drive the lid 7 to laterally move to form the open state, so that the lid 7 can be upwardly separated from the locating device of the invention, and the using operation of the locating device of the present invention is completed.

When the pulling member 31 of the pulling assembly 3 is at the open state, the abutting part 512 on a side of the base part 51 of the push member 5 is abutted against the press groove 312 of the pulling member 31, to keep the pulling member 31 of the pulling assembly 3 at the open state, so as to prevent the pulling assembly 3 from being closed automatically. When the pulling member 31 of the pulling assembly 3 is operated to close, the abutting part 512 on the side of the base part 51 is separated from the press groove 312 of the pulling member 31, so that the pulling assembly 3 can be closed smoothly.

The present invention has advantages below.

First, when the pulling member 31 of the pulling assembly 3 is pulled to rotate, the guiding member 1 of the sliding member 32 can be longitudinally moved in the guiding space 10, to make the sliding assembly 2 slide simultaneously in another direction opposite to the sliding direction of the sliding member 32, to form the open state or the closed state, so that the user can operate the locating device of the present invention, instead of the complicated assembly operation using screw for locking, to achieve the effect of decreasing whole operational difficulty and improving whole assembling speed.

Secondly, when the pulling assembly 3 is pulled to rotate to form the closed state, the engaging assembly 4 can clasp the pulling assembly 3 to form the locked state, and the operation of downwardly pulling to rotate once can directly lock the pulling assembly 3 without additional locking operation, thereby achieving simple operation and faster whole assembling operation speed.

Thirdly, when the engaging assembly 4 is opened, the convex push part 52 of the push member 5 can make the pulling member 31 of the pulling assembly 3 bounce upwardly, so that the pulling member 31 of the pulling assembly 3 can facilitate the user to pull, thereby improving smoothness of pulling operation.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A locating device, comprising:
a guiding member comprising a guiding space formed inside thereof;
a sliding assembly comprising a shaft part disposed inside thereof;
a pulling assembly comprising a pulling member comprising a sliding member disposed on a side thereof and configured to longitudinally reciprocate in the guiding space of the guiding member, and the pulling assembly comprising an axis coupling part disposed on other side thereof opposite to the sliding member and pivotally connected to the shaft part of the sliding assembly, wherein when the pulling assembly is operated to close, the sliding member is longitudinally moved upwardly to a closed position in the guiding space, and make the sliding assembly simultaneously slide in an another direction opposite to a sliding direction of the sliding member, and when the pulling assembly is opened, the sliding member is longitudinally moved downwardly to an open position in the guiding space, and make the sliding assembly simultaneously move back.

2. The locating device according to claim 1, wherein the guiding member comprises a fastening part disposed on a surface thereof and configured to fasten with a preset plate, and the fastening part comprises a plurality of fastening holes cut through two opposite sides of a surface of the guiding member, and a plurality of first fixing elements are disposed in the plurality of fastening holes, respectively.

3. The locating device according to claim 1, wherein the shaft part of the sliding assembly comprises two opposite shaft holes cut through a surface of the sliding assembly, and the axis coupling part of the pulling assembly comprises a shaft extended outwardly from two opposite sides thereof and configured to pivotally connect to and fastened in the two shaft holes.

4. The locating device according to claim 1, wherein the sliding assembly comprises a pass hole cut through the surface thereof, and a through hole outwardly cut through a rear sidewall of the pass hole and having an larger outer diameter, and the pulling member of the pulling assembly comprises a shaft block extended obliquely from a side thereof and downwardly inserted through the through hole and laterally inserted into the pass hole, and the shaft block comprises a sliding member disposed an end thereof.

5. The locating device according to claim 1, further comprising an engaging assembly, Wherein the sliding assembly comprises a first locating part disposed on a rear part of a surface thereof, and the engaging assembly is mounted on the first locating part and comprises a clasping member configured to laterally reciprocate and an elastic element to enable the clasping member to laterally reciprocate, wherein the clasping member comprises a first connection part disposed on a surface thereof and configured to combine with the first locating part; and a clasping part disposed on a front side thereof, and an accommodating groove formed on a bottom surface thereof, and the elastic element is accommodated in the accommodating groove, and the pulling member of the pulling assembly comprises an engaging member disposed on a bottom thereof and configured to engage with the clasping part.

6. The locating device according to claim 5, wherein the first locating part of the sliding assembly has a plurality of first locating holes formed on a surface of the sliding assembly, and a hole formed in front of the plurality of first locating holes and configured for insertion of the engaging member of the pulling assembly, and the first connection part comprises a plurality of combination holes cut therethrough and corresponding in position to the plurality of first locating holes, and a plurality of fastening members are disposed in the plurality of combination holes, respectively, and configured to be fastened in the first locating hole.

7. The locating device according to claim 5, wherein the engaging member of the pulling assembly comprises a buckle, and the buckle has a guiding incline formed on a rear side thereof, and the clasping part of the clasping member has a clasping groove recessed on a bottom surface of the clasping member and configured to clasp and locate the buckle.

8. The locating device according to claim 1, wherein the sliding member of the pulling assembly comprises pulleys disposed on two sides thereof, respectively, and configured to slide and rotate in the guiding space of the guiding member.

9. The locating device according to claim 1, wherein the sliding assembly comprises a second locating part disposed on a surface thereof; and the second locating part comprises a push member disposed thereon and made by elastic material, and the push member comprises a base part, and the base part comprises a second connection part disposed on a surface and configured to combine with the second locating part, and the base part comprises a push part extend on a side thereof, having a convex shape, and elastically abutted against the bottom surface of the pulling member when the pulling assembly is closed.

10. The locating device according to claim 9, wherein the second locating part of the sliding assembly has a plurality of second locating holes cut through the surface of the sliding assembly, and the second connection part of the base part has a plurality of riveting holes cut therethrough, corresponding in position to the plurality of second locating holes, and riveted into the plurality of second locating holes, and the base part comprises an abutting part disposed on other side thereof opposite to the push part, and the pulling member of the pulling assembly has a press groove formed on the bottom surface thereof and configured to abut against the abutting part in an open state.

* * * * *